US011923656B2

(12) United States Patent
Jentzsch et al.

(10) Patent No.: US 11,923,656 B2
(45) Date of Patent: Mar. 5, 2024

(54) PHASE-COUPLED LASER ASSEMBLY AND METHOD FOR PRODUCING A PHASE-COUPLED LASER ASSEMBLY

(71) Applicant: OSRAM OLED GmbH, Regensburg (DE)

(72) Inventors: Bruno Jentzsch, Regensburg (DE); Alexander Behres, Pfatter (DE); Hans-Jürgen Lugauer, Sinzing (DE)

(73) Assignee: OSRAM OLED GmbH, Regensburg (DE)

( * ) Notice: Subject to any disclaimer, the term of this patent is extended or adjusted under 35 U.S.C. 154(b) by 168 days.

(21) Appl. No.: 17/277,032

(22) PCT Filed: Aug. 9, 2019

(86) PCT No.: PCT/EP2019/071464
§ 371 (c)(1),
(2) Date: Mar. 17, 2021

(87) PCT Pub. No.: WO2020/057856
PCT Pub. Date: Mar. 26, 2020

(65) Prior Publication Data
US 2021/0273400 A1 Sep. 2, 2021

(30) Foreign Application Priority Data
Sep. 21, 2018 (DE) .......................... 102018123320.5

(51) Int. Cl.
*H01S 5/026* (2006.01)
*H01S 5/042* (2006.01)
(Continued)

(52) U.S. Cl.
CPC .......... *H01S 5/026* (2013.01); *H01S 5/04256* (2019.08); *H01S 5/0624* (2013.01); *H01S 5/423* (2013.01)

(58) Field of Classification Search
CPC ....... H01S 5/423; H01S 5/026; H01S 5/04256
See application file for complete search history.

(56) References Cited

U.S. PATENT DOCUMENTS 6,600,765 B2 * 7/2003 Evans .................... H01S 5/423
372/50.1
6,959,027 B1 10/2005 Guilfoyle et al.
(Continued)

FOREIGN PATENT DOCUMENTS

| CN | 107994459 A | 5/2018 |
| JP | H2-54981 A | 2/1990 |

(Continued)

OTHER PUBLICATIONS

International Search Report and Written Opinion in corresponding International Application No. PCT/EP2019/071464 dated Nov. 14, 2019, 16 pages.

(Continued)

*Primary Examiner* — Minsun O Harvey
*Assistant Examiner* — Stephen Sutton Kotter
(74) *Attorney, Agent, or Firm* — MH2 TECHNOLOGY LAW GROUP LLP (57) ABSTRACT

A laser device is provided which comprises a common waveguide layer and a plurality of laser bodies, wherein each of the laser bodies has an active region configured for generating coherent electromagnetic radiation. The laser bodies are arranged side by side on the common waveguide layer, wherein the laser bodies are directly adjacent to the common waveguide layer. In particular, the laser bodies are configured to be phase-coupled to each other via the waveguide layer during operation of the laser device.
Furthermore, a method for producing such a phase-coupled laser device is provided.

18 Claims, 4 Drawing Sheets

(51) Int. Cl.
*H01S 5/062* (2006.01)
*H01S 5/42* (2006.01)

(56) References Cited

U.S. PATENT DOCUMENTS

| | | | | |
|---|---|---|---|---|
| 8,615,028 B1 * | 12/2013 | Sayyah | ................ | H01S 5/4006 |
| | | | | 372/50.12 |
| 2001/0026857 A1 * | 10/2001 | Kinoshita | ............... | H01S 5/423 |
| | | | | 372/66 |
| 2004/0012845 A1 | 1/2004 | Wang | | |
| 2009/0067774 A1 * | 3/2009 | Magnusson | ............ | B82Y 20/00 |
| | | | | 385/10 |

FOREIGN PATENT DOCUMENTS

| | | |
|---|---|---|
| JP | H9-246639 A | 2/1990 |
| JP | H0254981 A | 2/1990 |
| JP | H2-31477 A | 1/1991 |
| JP | H11-284283 A | 10/1999 |
| JP | 2000151014 A | 5/2000 |
| JP | 2001-281473 A | 10/2001 |
| JP | 2004289163 A * | 10/2004 ........... G02B 6/4202 |
| JP | 2006-286810 A | 10/2006 |
| WO | 02089272 A1 | 11/2002 |

OTHER PUBLICATIONS

Japanese Office Action dated Dec. 13, 2022, JP Application No. 2021-515630, pp. 1-16 (Including English Translation of Refusal).
Japanese Notification of Reasons for Refusal dated Jun. 20, 2022, JP Application No. 2021-515630, pp. 1-18 (Including English Translation of Refusal).
Japanese Decision to Grant dated May 9, 2023, JP Application No. 2021-515630, 3 pages.

* cited by examiner

PHASE-COUPLED LASER ASSEMBLY AND METHOD FOR PRODUCING A PHASE-COUPLED LASER ASSEMBLY

CROSS-REFERENCE TO RELATED APPLICATIONS

This patent application is a national stage entry from International Application No. PCT/EP2019/071464, filed on Aug. 9, 2019, published as International Publication No. WO 2020/057856 A1 on Mar. 26, 2020, and claims priority under 35 U.S.C. § 119 from German patent application 10 2018 123 320.5, filed Sep. 21, 2018, the entire contents of all of which are incorporated by reference herein.

A laser device is provided which is configured in particular to be phase-coupled. Furthermore, a method for producing a laser device, in particular a phase-coupled laser device, is provided.

For generating a structured far field in the form of a diffraction pattern, an emitter array with imaging optics is usually used. The use of several single emitters with complex optics is usually elaborate and cost-intensive. For varying the direction of the diffraction pattern, movable optical elements or complex housings are usually used.

One object is to specify a compact laser device that can be manufactured in a simplified manner, in particular for generating a structured far field of a point lattice. Another object is to specify a cost-effective method for producing a laser device, in particular a laser device described here.

These objects are solved by the laser device according to the independent claim as well as by the method for producing a laser device. Further embodiments of the laser device or of the method for producing a laser device are the subject-matter of the further claims.

A laser device having a common waveguide layer is disclosed. The laser device has a plurality of laser bodies arranged on the common waveguide layer. In particular, the laser bodies are directly adjacent to the waveguide layer. It is possible that the laser bodies and the waveguide layer are formed as one piece. Particularly preferably, the common waveguide layer and the laser bodies or at least parts of the laser bodies and the common waveguide layer are formed from one piece. In this sense, the laser device comprising the common waveguide layer and the plurality of laser bodies is in particular formed monolithically. For example, there is a smooth continuous transition between the common waveguide layer and the laser bodies.

According to at least one embodiment of the laser device, each of the laser bodies has an active zone that is configured in particular for generating coherent electromagnetic radiation. For example, the active zone of the respective laser body is provided for generating electromagnetic radiation in the infrared, visible or ultraviolet spectral range. The laser bodies may be based on a III-V or on a II-VI compound semiconductor material. For example, each of the laser bodies has a semiconductor body comprising the active region based on such a compound semiconductor material. The semiconductor bodies of the laser bodies may be based on the same compound semiconductor material.

Different semiconductor layers or bodies are based on the same compound semiconductor material if these layers or bodies have at least one identical element, for example from main group II or III, and another identical element, for example from group VI or V. In addition to the two identical elements, the semiconductor layers or bodies may have additional elements, in particular from the same groups or from other groups to form binary, tertiary or quaternary compounds. For example, the layers of the laser bodies and the layers of the common waveguide layer are based on an arsenide, nitride, phosphide, sulfide, or selenide compound semiconductor, such as GaN, InP, ZnS, or ZnSe compound semiconductors. In addition to the active region, the semiconductor body may comprise a first semiconductor layer and a second semiconductor layer, with the active region disposed between the semiconductor layers. In particular, the active region is a pn-junction of the semiconductor body or of the laser body.

According to at least one embodiment of the laser device, the laser bodies are arranged next to each other on the common waveguide layer. In lateral directions, the laser bodies may be spatially spaced apart from each other. For example, the laser bodies are grown, in particular epitaxially grown, on the common waveguide layer. The laser bodies may have identical structure. Within manufacturing tolerances, the laser bodies may be configured to generate electromagnetic radiation of the same wavelength. In particular, the laser bodies are configured to generate single-mode radiation.

A lateral direction is understood to be a direction directed parallel for instance to a main extension surface of the common waveguide layer. A vertical direction is understood to be a direction that is perpendicular in particular to the main extension surface of the common waveguide layer. In particular, the vertical direction and the lateral direction are orthogonal to each other.

According to at least one embodiment of the laser device, via the common waveguide layer during operation of the laser device, the laser bodies are formed to be phase-coupled to each other. If the laser bodies are formed to be phase-coupled to each other, at least the main modes of the radiations emitted by the laser bodies or by the semiconductor bodies have a constant or substantially constant phase relationship to each other during operation of the laser device. The laser bodies can be phase-coupled to each other, in particular truly phase-coupled to each other, if a predetermined lateral distance between adjacent laser bodies is maintained. The predetermined distance depends in particular on the peak wavelength of the emitted electromagnetic radiation and on the refractive index of the common waveguide layer. It is possible that active elements are integrated or formed in the waveguide layer which are configured to change the refractive index, in particular to change the local refractive index of the common waveguide layer.

In at least one embodiment, the laser device comprises a common waveguide layer and a plurality of laser bodies. The laser bodies each have an active region configured to generate coherent electromagnetic radiation. The laser bodies are arranged side by side on the common waveguide layer. Particularly preferably, the laser bodies are directly adjacent to the common waveguide layer. In operation of the laser device, the laser bodies are formed to be phase-coupled to one another, in particular via the waveguide layer.

Particularly preferably, the laser bodies and the common waveguide layer are of monolithic form. For example, the laser bodies each have the shape of a surface-emitting laser diode, such as a VCSEL (vertical-cavity surface-emitting laser). In particular, the radiation emitted during operation emerges vertically along a vertical direction from the corresponding laser body. For instance, the laser device has a plurality of laser bodies, each of which has an aperture, the aperture being formed on a surface of the respective laser body facing away from the common waveguide layer. An aperture is in particular an exit aperture of the radiation emitted during operation of the laser body.

In virtue of the one-piece or monolithically formed laser device comprising of a plurality of laser bodies and a common waveguide layer, wherein the electromagnetic radiations generated by the laser bodies are phase-coupled to each other, a particularly compact component can be provided which is particularly suitable for generating a structured far field in the form of a diffraction pattern of a one-dimensional or two-dimensional point lattice. With such a monolithically integrated component, moreover, the radiation direction can be controlled in a simplified manner, in particular by electrical signals. In this case, it is not necessary to use movable optical elements or complex housings to vary the direction. The variation of direction or the adjustment of the radiation direction of the laser device can be achieved by targeted phase coupling of the laser bodies, for example by local electrical control and/or by local adjustment of the refractive index of the common waveguide layer.

According to at least one embodiment of the laser device, the laser bodies each have a sublayer directly adjacent to the common waveguide layer. The sublayers of the laser bodies and of the common waveguide layer may be formed from the same material or, at least at a transition region, from the same material. In particular, there is a smooth transition region between the common waveguide layer and the laser body sublayers. For example, the laser bodies, in particular the sublayers of the laser bodies, are directly grown on the common waveguide layer. It is possible that originally, the sublayers of the laser bodies are integral parts of the common waveguide layer which are assigned to the laser bodies during the course of the production of the laser bodies. In particular, the laser bodies are local vertical elevations on the common waveguide layer.

According to at least one embodiment of the laser device, it has a common carrier on which the common waveguide layer is arranged. In the vertical direction, the common waveguide layer is arranged in particular between the common carrier and the laser bodies. Preferably, the laser device is mechanically stabilized and thus mechanically supported by the common carrier. In particular, the common carrier has a higher mechanical stability than the common waveguide layer. The common carrier may be formed from an electrically insulating material, an electrically conductive material, or from a semiconductor material. For example, the common carrier is a ceramic body, a semiconductor body or a metal body. In particular, the common carrier is different from a growth substrate on which the common waveguide layer and/or the plurality of laser bodies are/is epitaxially grown. However, it is also conceivable that the common carrier is a growth substrate which is, for example, a sapphire substrate or a semiconductor substrate.

According to at least one embodiment of the laser device, it has a coupling layer comprising a plurality of coupling structures. The coupling layer is arranged in particular on a rear side of the common waveguide layer facing away from the laser bodies. In a top view of the common waveguide layer, the coupling structures may be covered, in particular completely covered, by the laser bodies. If the radiation emitted by a laser body is coupled into the common waveguide layer along the vertical direction, at the coupling structures, the electromagnetic radiation can be redirected in a lateral direction. By propagating laterally, the electromagnetic radiation can cause phase coupling between the laser bodies to occur. For example, a stationary wave field can be formed in the common waveguide layer which provides a defined phase coupling of the laser bodies, in particular of all laser bodies of the laser device.

According to at least one embodiment of the laser device, the coupling structures extend into the common waveguide layer. In particular, the coupling structures are formed to be reflective for the electromagnetic radiation generated by the laser bodies during operation of the laser device. For example, the coupling structures are each provided with a reflective layer or formed from a radiation-reflective material. It is possible that the coupling structures are formed with respect to the material composition of the common waveguide layer in such a way that total reflections take place or are favored at the coupling structures. The coupling layer may be formed of an electrically insulating material or of an electrically conductive material. If the coupling layer is formed to be electrically conductive, the coupling layer can serve as a contact layer for the laser device, in particular for the common waveguide layer or for the laser bodies.

According to at least one embodiment of the laser device, during operation of the laser device, a lateral distance between adjacent laser bodies is $m\cdot\lambda/n$, where m is an integer natural number, $\lambda$ is the wavelength of radiation coupled into the common waveguide layer and n is the refractive index of the common waveguide layer. In other words, the lateral distance between the adjacent laser bodies is a multiple of the wavelength of the radiation coupled into the common waveguide layer. In particular, the lateral distance is the path length or coupling distance between the adjacent laser bodies. Since m is any integer, the lateral distances between the different adjacent laser bodies may be the same or different.

According to at least one embodiment of the laser device, electrically controllable active elements are integrated or formed in the common waveguide layer. The active elements are preferably configured for local adjustment of the refractive index of the common waveguide layer. This may be necessary, for example, if due to manufacturing tolerances the coupling path or the optical path length is not a multiple of the wavelength. The active element may be integrated in the form of a Wannier-Stark modulator in the waveguide layer. Due to an electric field applied to the common waveguide layer, such a modulator can cause a change in the refractive index, in particular a change in the local refractive index of the common waveguide layer. In this way, the coupling path or optical path length between the adjacent laser bodies can be corrected during operation of the laser device. The active elements integrated or formed in the common waveguide layer thus serve to control the refractive index or to adjust the refractive index of the common waveguide layer.

According to at least one embodiment of the laser device, the common waveguide layer comprises an active region which is in particular located in the coupling path of the waveguide layer. The common waveguide layer may comprise a first sublayer and a second sublayer, wherein the active region is arranged in the vertical direction between the first sublayer and the second sublayer. For example, the active region of the common waveguide layer is configured to generate electromagnetic radiation. The waveguide layer having the active region may serve as an optical amplifier.

Alternatively or additionally, it is possible that the active region is configured to adjust the local refractive index of the common waveguide layer. In particular, the active region forms a sub-region of the active element or active elements integrated or formed in the common waveguide layer.

According to at least one embodiment of the laser device, the active region of the common waveguide layer is implemented as an active quantum well layer of a Wannier-Stark modulator. In particular, during operation of the laser device, due to an applied electric field, the modulator causes a change of the refractive index, especially a local adjustment of the refractive index of the common waveguide layer.

According to at least one embodiment of the laser device, the laser bodies are arranged in at least one row on the common waveguide layer. The laser device may include a plurality of rows and columns of the laser bodies on the common waveguide layer. For example, the laser bodies form a matrix-like array of the laser bodies on the common waveguide layer. The row or column of the laser bodies may have a laser body arranged at one edge, which is formed in particular as a guiding laser body. For example, the guiding laser body is configured such that out from the guiding laser body, electromagnetic radiation emitted by the guiding laser body can be coupled exclusively in the direction of the common waveguide layer. The radiation coupled into the common waveguide layer can propagate along the common waveguide layer and stimulate the other laser bodies to emit phase-coupled electromagnetic radiation. The other laser bodies, in particular those stimulated by the guiding laser body, can be both electrically and optically pumped, for example optically pumped by the radiation generated by the guiding laser body.

On its surface facing away from the common waveguide layer, the guiding laser body can have a radiation-reflecting layer, which in particular completely covers the guiding laser body and thus prevents the out-coupling of the radiation at this surface. The radiation-reflecting layer can be formed as a radiation non-transmissive contact layer of the guiding laser body. If electromagnetic radiation is generated in the guiding laser body, it is reflected back at the radiation-reflecting layer towards the waveguide layer and coupled into the common waveguide layer. The guiding laser body arranged at the edge can thus predefine the phase of the radiation emitted by the laser bodies of the same row or column. In particular, the guiding laser body does not have a radiation-transmissive aperture on its surface facing away from the common waveguide layer. Apart from the guiding laser body or guiding laser bodies, the other laser bodies can each have a radiation-transmissive aperture on their surfaces facing away from the common waveguide layer.

The laser device can have a plurality of laser bodies forming several rows and columns of laser bodies on the common waveguide layer, wherein at most except for one laser body arranged at the edge or except for the laser bodies arranged at the edge, each of the laser bodies of the same row or same column has a radiation-transmissive aperture facing away from the common waveguide layer. The phase coupling takes place in particular due to the guiding laser body which in particular determines the phase of the emitted radiation/s. It is possible that in this case no stationary wave field is formed in the common waveguide layer.

In all embodiments, active elements configured for controlling or matching refractive index may be integrated or formed in the common waveguide layer. The active elements can be used to control the phase relationship of the individual laser bodies among each other and thus the out-coupling direction in a targeted manner.

According to at least one embodiment, the laser device comprises a first electrode and a second electrode. In particular, the laser bodies are arranged along the vertical direction between the first electrode and the second electrode. In particular, the first electrode and the second electrode are arranged for electrically contacting the laser bodies and/or the common waveguide layer. The first electrode can have a plurality of contact layers, in particular contact layers that can be connected individually, wherein each of which is assigned to one of the laser bodies. The contact layers of the first electrode can each be individually connected to an external voltage source. The second electrode may be formed contiguously and may serve as a common electrode. Alternatively, it is possible for the second electrode to have a plurality of individually connectable contact layers configured to electrically connect the laser bodies and/or to locally electrically connect the common waveguide layer.

The laser device can have a third electrode, which is configured in particular for electrically connecting the common waveguide layer. The second electrode may be arranged in the vertical direction between the first electrode and the third electrode. In particular, the third electrode is formed to be contiguous. The common waveguide layer can be locally selectively electrically connected via the third electrode and the second electrode which in particular has a plurality of laterally spaced contact layers. For example, the third electrode and the second electrode are configured for electrically connecting the active elements integrated or formed in the common waveguide layer.

According to at least one embodiment of the laser device, the first electrode and the third electrode are assigned to a first electrical polarity of the laser device. The second electrode is assigned in particular to a second electrical polarity different from the first electrical polarity. The first electrode and the second electrode are in particular configured for electrically contacting the laser bodies. The second electrode and the third electrode are configured for instance for electrically contacting the common waveguide layer. The second electrode is thus a common electrode that is configured both for electrically contacting the laser bodies and for electrically contacting the common waveguide layer.

According to at least one embodiment of the laser device, the common waveguide layer has at least one side surface which is provided in particular with a radiation non-transmissive layer. The radiation non-transmissive layer may be a radiation-reflecting mirror layer or a radiation-absorbing absorber layer. It is possible that at least two opposite or adjacent side surfaces of the waveguide layer are provided with the radiation-reflecting mirror layer or with the radiation-absorbing absorber layer. Furthermore, it is possible that all side surfaces of the common waveguide layer are provided with the mirror layer or with the absorber layer.

If two opposite side surfaces or all side surfaces of the waveguide layer are provided with mirror layers, a stationary wave field can be formed in the common waveguide layer, which establishes a defined phase coupling of the laser bodies, in particular of all laser bodies of the laser device. If the side surface of the waveguide layer is provided with an absorber layer, no stationary wave field can be formed in the waveguide layer. In this case, phase coupling can be established by a guiding laser body that is mirrored, in particular on the top side, i.e. on the side facing away from the waveguide layer.

A method for producing a laser device, in particular a laser device described herein, is specified. A waveguide layer is provided. A coherent laser body composite may be formed directly on the common waveguide layer. In a subsequent process step, the coherent laser body composite may be structured into a plurality of laterally spaced laser bodies on the common waveguide layer. In this process, a material of the laser body composite can be removed in such a way that intermediate regions are formed which extend through the laser body composite, in particular up to the common waveguide layer or into the waveguide layer.

The laser bodies are formed in particular as local elevations on the common waveguide layer, wherein the laser bodies are enclosed by the intermediate regions in lateral directions. It is possible that the intermediate regions are subsequently filled with an encapsulation material, in particular with an electrically insulating material. For structuring the laser body composite into a plurality of laser bodies, a mechanical process, for example by material removal, or a chemical process, for example an etching process, or a laser separation process can be applied.

The method described herein is particularly suitable for the production of a laser device described herein. The features described in connection with the laser device can therefore also be used for the method, and vice versa.

Further embodiments and further developments of the laser device or of the method for producing the laser device will become apparent from the exemplary embodiments explained below in connection with FIGS. 1A to 5.

Identical, equivalent or equivalently acting elements are indicated with the same reference numerals in the figures.

The figures are schematic illustrations and thus not necessarily true to scale. Comparatively small elements and particularly layer thicknesses can rather be illustrated exaggeratedly large for the purpose of better clarification.

Figure 1A:
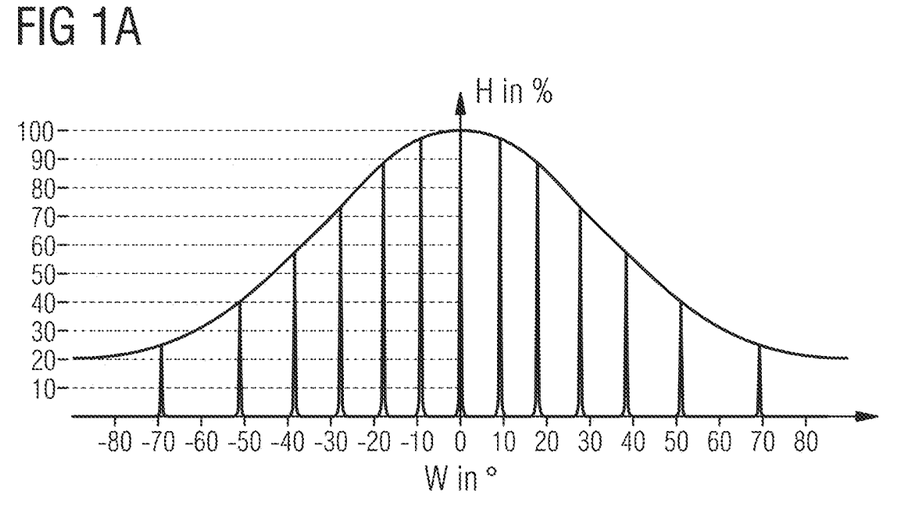
FIGS. 1A and 1B show schematic illustrations of the brightness distribution of a diffraction pattern of a one-dimensional and two-dimensional point lattice of a plurality of laser bodies in the far field, respectively.
Figure 1B:
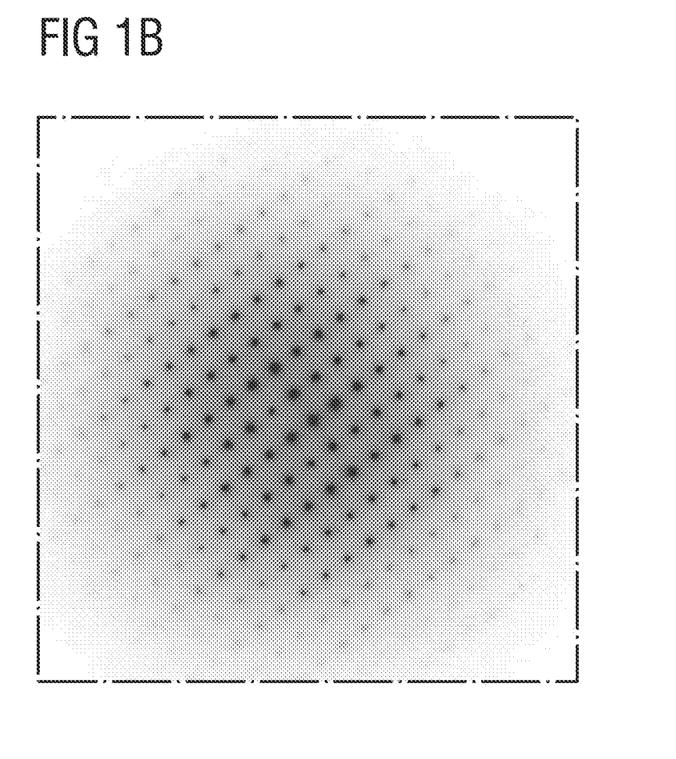

Each of FIGS. 1A and 1B shows a structured far field in the form of a diffraction pattern of a one-dimensional and a two-dimensional point lattice, respectively, from a monolithically integrated laser device described here. In FIG. 1A, the normalized brightness distribution H as a function of the distribution angle W is schematically shown. In FIG. 1B the brightness distribution is schematically shown in two dimensions. In particular, with the laser devices shown in FIGS. 3A, 3B, 4 and 5, the direction of radiation can furthermore be controlled by electrical signals, as a result of which dynamic control of geometric patterns can be achieved.

Figure 2A:
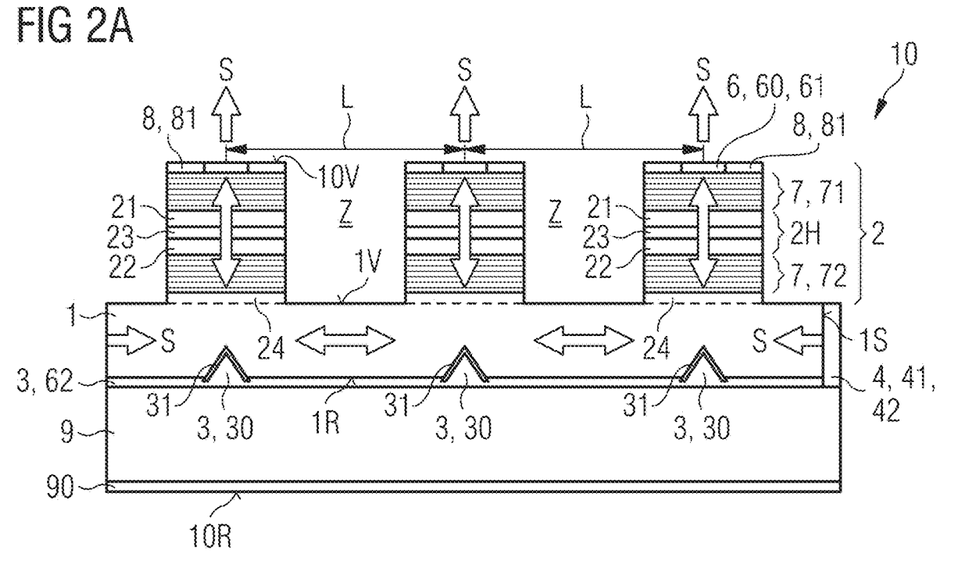
FIGS. 2A and 2B show schematic illustrations of some embodiments of a laser device in sectional views.

FIG. 2A shows a laser device 10 having a plurality of laser bodies 2 arranged on a common waveguide layer 1. In particular, the laser bodies 2 are formed as local elevations on the common waveguide layer 1. In the lateral directions, the laser bodies 2 are spatially spaced apart from each other by intermediate regions Z. Each of the laser bodies 2 is formed in an island-like manner and in particular, is fully enclosed by the intermediate regions Z. The intermediate regions Z can be filled with air or with a solid, in particular electrically insulating, material.

The laser bodies 2 and the common waveguide layer 1 can be of one-piece or monolithic design. The laser bodies 2 may each have a sublayer 24 immediately adjacent to the common waveguide layer 1, which has the same material as the common waveguide layer 1 at least in a transition region between the sublayer 24 and the waveguide layer 1. For example, the sublayers 24 of the laser bodies 2 and the common waveguide layer 1 may be formed from a single piece. In particular, there are smooth transitions between the sublayers 24 and the common waveguide layer 1. For example, there is no clear interface, in particular no clearly detectable interface between the common waveguide layer 1 and the laser bodies 2 or between the common waveguide layer 1 and the sublayers 24 of the laser bodies 2.

The laser bodies 2 and the common waveguide layer 1 are further considered to be of one-piece or monolithic design if the laser bodies 2 are in particular directly applied to the common waveguide layer 1. For example, there is no bonding layer, in particular no adhesive layer, glue layer or solder layer, in the vertical direction between the laser bodies 2 and the waveguide layer 1. This is shown schematically, for example, in FIG. 2B, wherein the sublayer 24 associated with a mirror assembly 72 is formed directly on the waveguide layer 1. In this case, the sublayer 24 and the waveguide layer 1 may have different material compositions in a common transition region.

Each of the laser bodies 2 has a semiconductor body 2H. In particular, the semiconductor body 2H has a first semiconductor layer 21 of a first charge carrier type, a second semiconductor layer 22 of a second charge carrier type different from the first charge carrier type, and an active zone 23 arranged between the semiconductor layers 21 and 22. In operation of the laser device 10, the active zone 23 is particularly configured to generate coherent electromagnetic radiation. In particular, the active zone 23 is a pn-junction zone. The first semiconductor layer 21 may be n-conductive. The second semiconductor layer may be p-conductive. However, it is possible that the first semiconductor layer 21 is p-conductive and the second semiconductor layer 22 is n-conductive.

The laser bodies 2 each have a first mirror arrangement 71 facing away from the waveguide layer 1 and a second mirror arrangement 72 facing towards the waveguide layer 1. In particular, the first mirror arrangement 71 and the second mirror arrangement 72 form a laser resonator 7 of the laser body 2. The mirror arrangements 71 and 72 may be Bragg mirrors, in particular electrically conductive Bragg mirrors, or Bragg mirrors made of semiconductor materials. It is possible that the semiconductor body 2H, the first mirror arrangement 71, the second mirror arrangement 72, the sublayer 24 and/or the waveguide layer 1 are based on the same semiconductor compound material.

The second mirror arrangement 72, which is arranged in the vertical direction between the active zone 23 and the common waveguide layer 1, is in particular formed to be partially transparent to radiation. In particular, the second mirror arrangement 72 is formed to be at least partially transparent to the radiation S generated in the active zone 23 during operation of the laser device 10, so that the radiation S generated by the active zone 23 can be coupled through the second mirror arrangement 72 into the common waveguide layer 1. It is possible that the second mirror arrangement 72 has a lower reflectivity than the first mirror arrangement 71. Alternatively or additionally, it is possible that the second mirror arrangement 72 has a reflectivity for the radiation generated in the active zone 23 of at most 99%, 95%, 90% or of at most 80%, for instance between 50% and 99% inclusive, or between 60% and 95% inclusive, or between 60% and 80% inclusive.

According to FIG. 2A, the laser bodies 2 each have a radiation passage region 6. In particular, the radiation passage region 6 has an aperture 60. The aperture 60 may be formed by a radiation-transmissive contact layer 61. For example, the contact layer 61 is formed from a transparent electrically conductive material, for instance from a transparent electrically conductive oxide. In particular, the aperture 60 is fully surrounded in lateral directions by an insulation layer 8, in particular by a first insulation layer 81. The radiation passage region 6 is located in particular on a front side 10V of the laser device 10 facing away from the waveguide layer 1. Radiation S emitted by the semiconductor body 2H can be coupled out of the laser body 2 through the aperture 60. The contact layers 61 of different laser bodies 2 are each associated with one of the laser bodies 2 and can be electrically connected independently from each other. In particular, the contact layers 61 of the laser bodies 2 form a first electrode 61 of the laser device 10.

Deviating from this, it is possible that the insulation layer 8, in particular the first insulation layer 81, is replaced by an electrically conductive layer. In this case, the current can first be impressed over the entire surface of the laser body 2 and guided to the center by deeper-lying layers. The deeper-lying layers can be oxidized layers in the form of an aperture which narrow the current path from the outside. Alternatively or additionally, the deeper-lying layers can be doped, in particular highly doped current expansion layers located above and/or below the first mirror arrangement 71.

According to FIG. 2A, the laser device 10 may include a second electrode 62. The second electrode 62 may be formed as a common electrode for all laser bodies 2. In particular, the second electrode 62 is located on a rear side 1R of the common waveguide layer 1 facing away from the laser bodies 2. A front side 1V of the waveguide layer 1 facing the laser bodies 2 may be free of contact layers. In a top view of the waveguide layer 1, the front side 1V is covered in regions by the laser bodies 2 and not covered in regions by the laser bodies 2. At the areas not being covered, the front side 1V of the waveguide layer 1 can be freely accessible.

The laser device 10 has a coupling layer 3 on the rear side 1R of the waveguide layer 1. The coupling layer 3 has a plurality of coupling structures 30. In particular, the coupling structures 30 are local vertical elevations of the coupling layer 3 that extend into the common waveguide layer 1. The coupling structures 30 may be formed to be radiation reflective. For increasing the reflectivity of the coupling structures 30, each of them may be provided with a radiation-reflecting cover layer 31. The cover layer 31 can be formed from a highly reflective material, such as aluminum, silver, palladium or platinum. If the coupling layer 3 is formed from an electrically conductive material, the coupling layer 3 can simultaneously serve as a contact layer, in particular as a second electrode 62 or third electrode 63 of the laser device 10.

Alternatively, it is possible that the cover layer 31 is not an electrical contact layer. The cover layer 31 is in particular an optically active layer which couples a part of the horizontally running mode into the laser body 2 or into the laser bodies 2. In particular, the cover layer 31 and the waveguide layer 1 have different refractive indices.

In particular, the coupling layer 3 and/or the second contact layer 62 and/or the third electrode 63 directly adjoin/s the waveguide layer 1 at least in places. In the areas of the coupling structures 30, the cover layer 31 can be arranged in the vertical direction between the waveguide layer 1 and the associated coupling structure 30.

If the cover layer 31 is formed as an electrical contact layer, an electrical contact resistance between the waveguide layer 1 and the cover layer 31 can be lower than an electrical resistance between the waveguide layer 1 and the coupling layer 3. As a result, it can be achieved that charge carriers are preferably impressed via the cover layer 31 into the waveguide layer 1 and thus centrally into the laser bodies 2. It is possible that the cover layer 31 is configured for electrically contacting active elements 1A, which are integrated or formed in the waveguide layer 1, for example.

In top view, each of the laser bodies 2 may cover, in particular completely cover, at least one coupling structure 30. It is possible that in top view, the coupling layer 3 does not have a coupling structure 30 that is not covered by one of the laser bodies 2. It is also possible that each of the laser bodies 2 cover a single coupling structure 30 in top view.

According to FIG. 2A, the common waveguide layer 1 is formed as a single layer. In particular, the common waveguide layer 1 has the same material composition everywhere. The waveguide layer 1 is further implemented as a single layer if it is implemented as a layer sequence of several layers that have the same material composition.

According to FIG. 2A, the laser device 10 has a common carrier 9. The common waveguide layer 1 is located in particular in the vertical direction between the common carrier 9 and the laser bodies 2. The common carrier 9 serves in particular as a mechanically stabilizing carrier layer of the laser device 10. The common carrier 9 can be formed from an electrically insulating or from an electrically conductive material. According to FIG. 2A, the laser device 10 has a rear-side cover layer 90 arranged on a rear-side surface of the carrier 9. The rear-side cover layer 90 may be formed from an electrically insulating material or from an electrically conductive material. In the presence of the cover layer 90, a rear side 10R of the laser device is formed by exposed surface of the rear-side cover layer 90.

According to FIG. 2A, the laser bodies 2 are arranged to each other in such a way that they are phase-coupled to each other, for instance truly phase-coupled to each other. For example, a lateral distance L between two adjacent laser bodies 2 is a multiple of the wavelength of the radiation S coupled into the waveguide layer 1. A radiation non-transmissive layer 4 can be arranged on a side surface 1S of the waveguide layer or on all side surfaces 1S of the waveguide layer. If the radiation non-transmissive layer 4 is formed to be electrically conductive, an insulation layer may be disposed between the waveguide layer 1 and the layer 4 in the lateral direction. The radiation non-transmissive layer 4 can be a mirror layer 41 or an absorber layer 42. If mirror layers 41 are arranged on two opposite side surfaces 1S of the waveguide layer, a stationary wave field may be formed in the common waveguide layer 1. By forming a stationary wave field in the waveguide layer 1, phase coupling of the laser bodies 2 can be established.

Preferably, the coupling structure 30 is arranged centrally below an associated laser body 2. If electromagnetic radiation S is generated in the active zone 23, this can be coupled into the waveguide layer 1 and deflected in lateral directions at the associated coupling structure. The geometry of the coupling structure 30 may be selected such that the coupled electromagnetic radiation S is deflected in a desired lateral direction. For example, the coupling structure 30 has the shape of a pyramid or the shape of a cone. According to FIG. 2A, the coupling structure 30 has a lateral cross-section which increases with increasing vertical distance to the associated laser body 2.

Figure 2B:
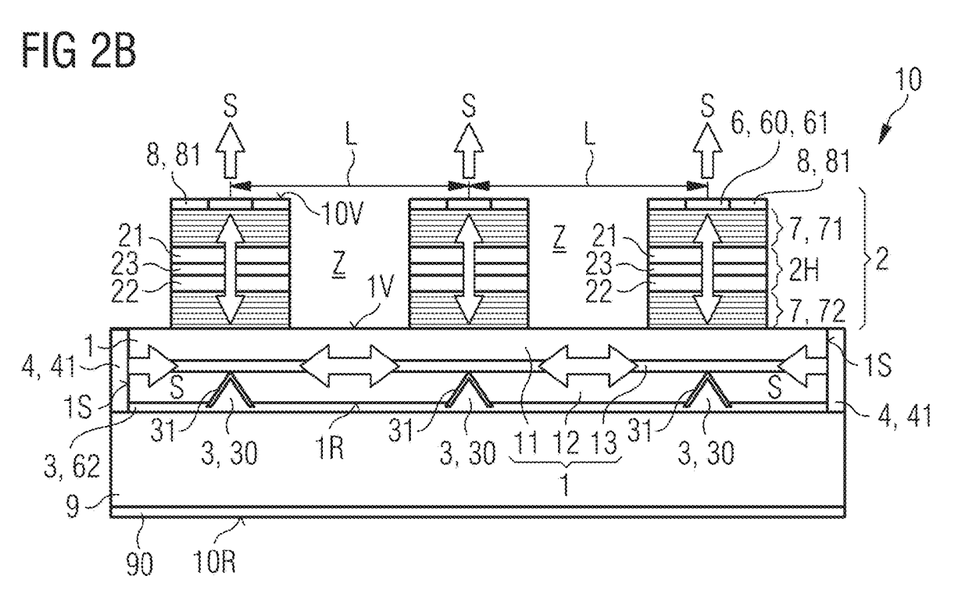

The exemplary embodiment shown in FIG. 2B is substantially the same as the exemplary embodiment for a laser device 10 shown in FIG. 2A. In contrast, FIG. 2B shows that the common waveguide layer 1 has an active region 13. Furthermore, the common waveguide layer 1 has a first sublayer 11 facing the laser bodies 2 and a second sublayer 12 facing away from the laser bodies 2. In particular, the first sublayer 11, the second sublayer 12 and the active region 13 of the waveguide layer 1 are semiconductor layers. The semiconductor layers 11, 12 and/or 13 may have different material compositions. The coupling structures 30 extend from the rear side 1R of the waveguide layer 1 into the second sublayer 12. In particular, the coupling structures 30 terminate in front of the active region 13.

With the active region 13, the common waveguide layer 1 additionally serves in particular as an optical amplifier. With the active region 13 and the sublayers 11 and 12, the waveguide layer 1 has, in particular, a diode structure which, in operation of the laser device 10, is configured for generating or amplifying electromagnetic radiation. According to FIG. 2B, mirror layers 41 are arranged on both opposite side surfaces 1S of the waveguide layer 1. If electromagnetic radiation is coupled from the laser bodies 2 into the waveguide layer 1, it is reflected at the coupling structures or at the cover layers 31 towards the mirror layers 41. The electromagnetic radiations are reflected back at the mirror layers 41, as a result of which a stationary wave field is formed in the waveguide layer 1, which establishes a well-defined phase coupling of the laser bodies 2, in particular of all laser bodies 2 of the laser device 10.

Figure 3A:
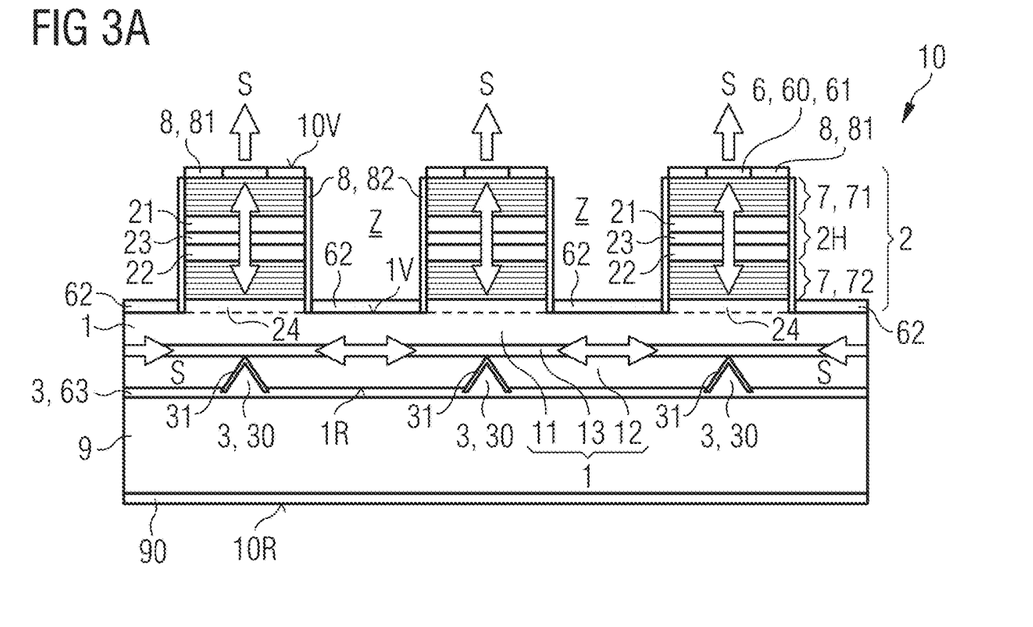
FIGS. 3A, 3B and 4 show schematic illustrations of further embodiments of a laser device in sectional views.

The exemplary embodiment shown in FIG. 3A essentially corresponds to the exemplary embodiment shown in FIG. 2B. In contrast, the laser device 10 has an electrode 62 arranged on the front side 1V, in particular directly on the front side 1V, of the waveguide layer 1. The electrode arranged on the rear side 1R of the waveguide layer 1 now serves as the third electrode 63 of the laser device 10. In particular, the first electrode 61 and the third electrode 63 are assigned to the same electrical polarity of the laser device 10. For example, the first electrode 61 and the third electrode 63 are configured for p-side contacting of the laser bodies 2 and/or of the waveguide layer 1. The second electrode 62 is configured for instance for electrically contacting the laser bodies 2 and the waveguide layer 1. Thus, the second electrode 62 is configured as a common electrode of the laser bodies 2 and of the waveguide layer 1. For example, the second electrode 62 serves for n-side contacting of the laser bodies 2 and of the waveguide layer 1.

The second electrode 62 may have a contiguous contact layer 62, which is arranged in particular in the free areas Z along lateral directions between the laser bodies 2. It is possible for the second electrode 62 to have a plurality of laterally spaced contact layers 62, wherein the contact layers 62 are formed to be individually contactable. Using the second electrode 62, the stationary wave field formed in the waveguide layer 1 can be electrically amplified. Alternatively or additionally, it is possible that the refractive index, in particular the local refractive index, of the waveguide layer 1 can be changed by selectively applying an electrical voltage to the second electrode 62, which in particular has a plurality of individually contactable contact layers 62.

As a further difference to FIG. 2B, the laser bodies 2 each have a lateral passivation layer 82 or a second insulation layer 82. In particular, the second insulation layers 82 are configured for electrically insulating the contact layers of the second electrode 62. The second insulation layer 82 may differ from the first insulation layer 81 with respect to its material composition. However, it is possible that the first insulation layer 81 and the second insulation layer 82 are formed from the same material. In this case, the insulation layers 81 and 82 can be manufactured in a common process.

Figure 3B:
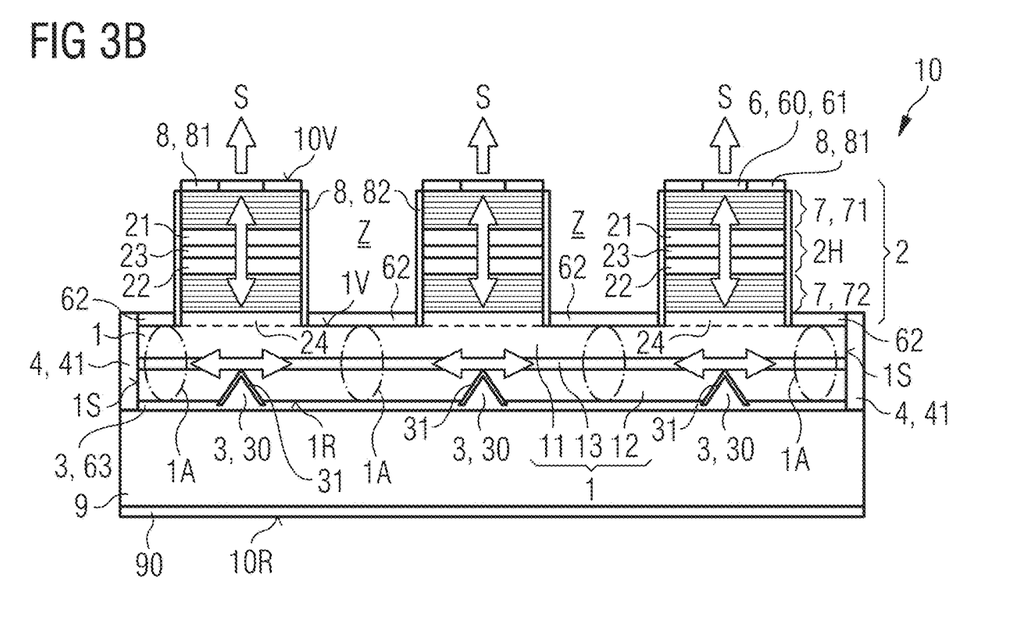

The exemplary embodiment shown in FIG. 3B essentially corresponds to the exemplary embodiment of a laser device 10 shown in FIG. 3A. In contrast, it is shown schematically in FIG. 3B that active elements 1A are integrated or formed in the waveguide layer 1. By integrating the active elements 1A, in particular for refractive index controlling or refractive index matching within the waveguide layer 1, the phase relationship of the individual laser bodies 2 to each other and thus the output coupling direction are controllable. The active elements 1A may be Wannier-Stark modulators. In particular, the active elements 1A serve as phase shifters in the coupling path. For example, the active region 13 forms at least one quantum well layer or multiple quantum well layers of the active elements 1A. In particular, the active elements 1A can be individually controlled via the second electrode 62 which preferably comprises a plurality of individually controllable contact layers 62.

In contrast to FIG. 3A, FIG. 3B shows mirror layers 41 applied to the side surfaces 1S of the waveguide layer 1. Deviating from FIG. 3A, it is possible that radiation non-transmissive layers 4, such as mirror layers 41 or absorber layers 42, are arranged on the side surfaces 1S.

Figure 4:
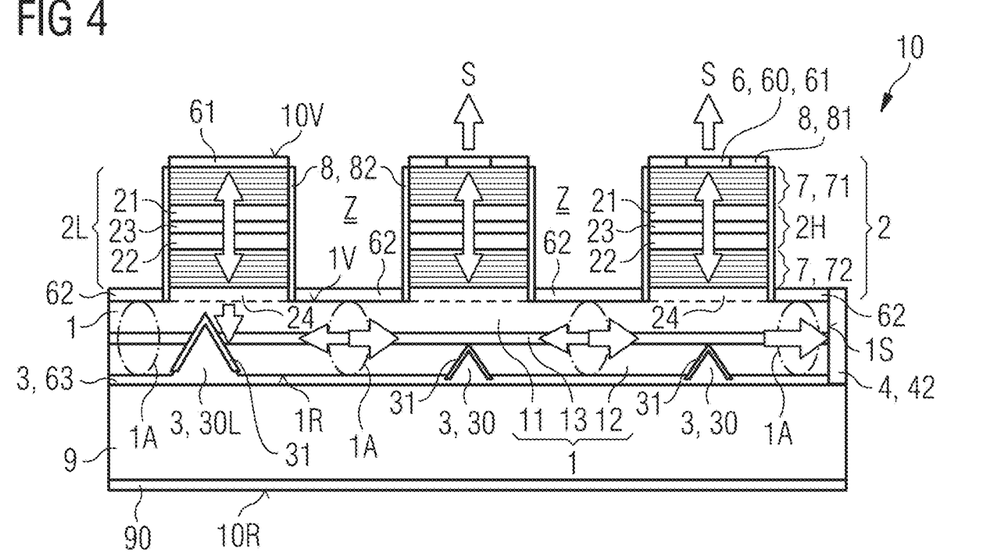

The exemplary embodiment shown in FIG. 4 essentially corresponds to the exemplary embodiment for a laser device 10 shown in FIG. 3B. In contrast, the laser device 10 has at least one guiding laser body 2L. The guiding laser body 2L does not have a radiation-transmissive aperture 60 at the front side 10V of the laser device 10. In particular, the guiding laser body 2L is covered, for instance completely covered, by a first contact layer 61 in top view, which is formed in particular to be opaque to radiation. The electromagnetic radiation S generated in the active zone 23 of the guiding laser body 2L is thus coupled exclusively into the waveguide layer 1.

In particular, the coupling layer 3 has a guiding coupling structure 30L, which is covered, in particular completely covered, by the guiding laser body 2L in top view. In contrast to the other coupling structures 30, the guiding coupling structure 30L has a larger vertical height and a larger cross-section. In particular, the guiding coupling structure 30L can extend through the second sublayer 12 and the active region 13 of the waveguide layer 1. Preferably, the guiding coupling structure 30L is configured to redirect the coupled radiation S in only one lateral direction, rather than in two opposite lateral directions. For example, the guiding coupler structure 30L is not arranged centrally below the guiding laser body 2L, but offset with respect to a central axis of the guiding laser body 2L, so that the radiation generated by the guiding laser body 2L is deflected in one lateral direction in a targeted manner.

In contrast to FIG. 3B, the laser device 10 shown in FIG. 4 has an absorber layer 42 on at least one side surface 1S or on several side surfaces 1S of the waveguide layer 1. Electromagnetic radiation is not reflected at the absorber layer 42, but absorbed. Thus, no stationary wave field is generated within the waveguide layer 1. Instead, the phase coupling is established by the guiding laser body 2L which is mirrored on the top side. By integrating the active elements 1A, in particular Wannier-Stark modulators, the phase relationship of the individual laser bodies 2 to each other and thus the out-coupling direction or the radiation direction are controllable.

Figure 5:
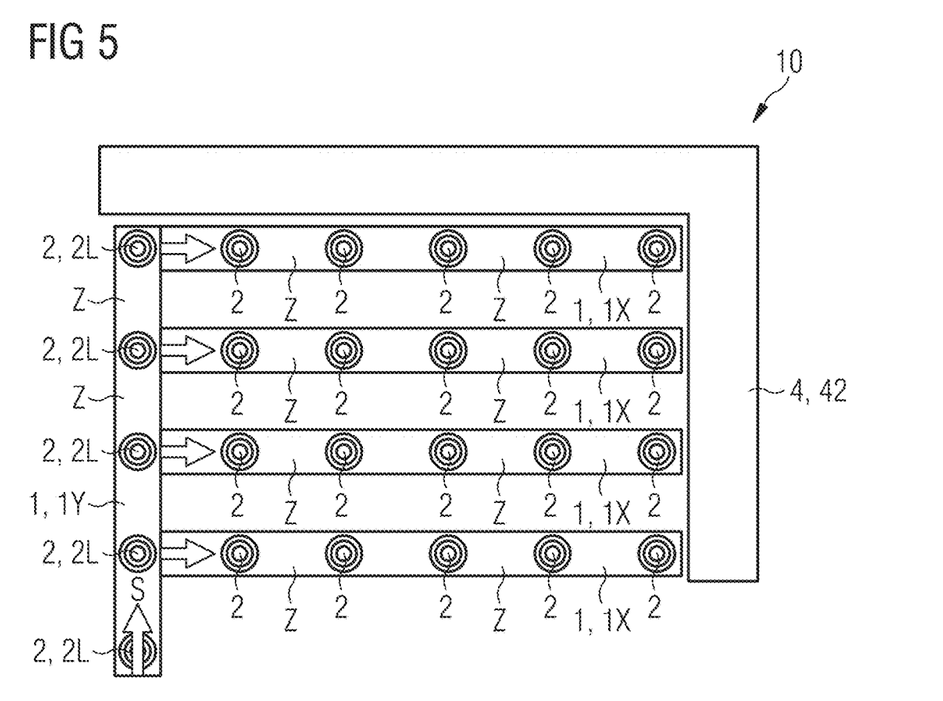
FIG. 5 shows schematic illustration of another embodiment of a laser device in top view.

FIG. 5 shows a top view of the laser device 10. The embodiment shown in FIG. 5 is substantially the same as the embodiment shown in FIG. 4. The waveguide layer 1 may have a first sub-region 1X and a second sub-region 1Y. For example, the first sub-region 1X extends along a first lateral direction, for instance along the longitudinal lateral direction. The second sub-region 1Y extends along a second lateral direction, for instance along the transverse lateral direction. According to FIG. 5, the waveguide layer 1 has a plurality of first sub-regions 1X. A plurality of guiding laser bodies 2L are arranged on the second sub-region 1Y, in particular forming a column of guiding laser bodies 2L of the laser device 10. On each of the first sub-regions 1X, a plurality of laser bodies each having an aperture 60 are arranged. The absorber layer 42 is arranged on two adjacent side surfaces 1S of the waveguide layer 1.

The concept explained in connection with FIG. 4 is implemented in two dimensions as shown in FIG. 5. In particular, the implementation is carried out with two differently controllable sub-regions 1X and 1Y which are modifiable with respect to the refractive index. Thus, the radiation direction of a diffraction pattern are controllable independently from each other in two lateral directions.

Using a phase-coupled, monolithically integrated and in particular single-mode laser device, the radiation direction or the out-coupling direction of the laser device from a plurality of laser bodies are controllable by electrical signals, as a result of which dynamic control of geometric patterns is achievable. In particular, the laser device is implemented as a single semiconductor chip without optics with optional control of the periodicity of a pattern to be imaged and/or with optional control of its radiation direction by electrical signals without using moving parts, for instance without using moving optical parts.

The invention is not restricted to the exemplary embodiments by the description of the invention made with reference to the exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A laser device comprising a common waveguide layer and a plurality of laser bodies, wherein
   the laser bodies each comprise an active zone configured to generate coherent electromagnetic radiation,
   the laser bodies are arranged side by side on the common waveguide layer,
   the laser bodies are directly adjacent to the common waveguide layer,
   the laser bodies are phase-coupled to each other via the waveguide layer during operation of the laser device, and
   the laser device further comprises a first electrode, a third electrode, and a second electrode disposed between the first electrode and the third electrode, wherein
      the first electrode and the third electrode are assigned to a first electrical polarity of the laser device,
      the second electrode is assigned to a second electrical polarity different from the first electrical polarity,
      the first electrode and the second electrode are configured for electrically contacting the laser bodies, and
      the second electrode and the third electrode are configured for electrically contacting the common waveguide layer.

2. The laser device according to claim 1,
wherein the laser bodies and the common waveguide layer are of monolithic form.

3. The laser device according to claim 1,
wherein each of the laser bodies has a sublayer directly adjacent to the common waveguide layer, the sublayers and the common waveguide layer being formed from the same material at least at their transition region.

4. The laser device according to claim 1,
which has a coupling layer comprising a plurality of coupling structures, wherein the coupling layer is arranged on a rear side of the common waveguide layer facing away from the laser bodies, and in a plan view of the common waveguide layer, the coupling structures are covered by the laser bodies.

5. The laser device according to claim 4,
wherein the coupling structures extend into the common waveguide layer and are formed to be radiation-reflective with regard to the electromagnetic radiation generated by the laser bodies during operation of the laser device.

6. The laser device according to claim 1,
wherein, in operation of the laser device, a lateral distance between adjacent laser bodies is $m \cdot \lambda / n$, where m is an integer, $\lambda$ is the wavelength of radiation coupled into the common waveguide layer and n is the refractive index of the common waveguide layer.

7. The laser device according to claim 1,
wherein electrically controllable active elements are integrated or formed in the common waveguide layer, the active elements being configured for locally adjusting the refractive index of the common waveguide layer.

8. The laser device according to claim 1,
wherein the common waveguide layer has an active region, the active region being formed as an active quantum well layer of a Wannier-Stark modulator which, during operation of the laser device, brings about a change in the refractive index of the common waveguide layer as a result of an applied electric field.

9. The laser device according to claim 1,
wherein the laser bodies are arranged at least in a row on the common waveguide layer, and at its edge the row has a guiding laser body which is configured in such a way that the electromagnetic radiation emitted by the guiding laser body is coupled out of the guiding laser body exclusively in the direction of the common waveguide layer, propagates along the common waveguide layer and stimulates the other laser bodies to emit phase-coupled electromagnetic radiation.

10. The laser device according to claim 9,
wherein the guiding laser body arranged at the edge predetermines the phase of the radiations emitted by the laser bodies of the same row or column, the guiding laser body being free of a radiation-transmissive aperture on its surface facing away from the common waveguide layer.

11. The laser device according to claim 1,
wherein the laser bodies form a plurality of rows and columns of laser bodies on the common waveguide layer, and with the exception of at most one laser body arranged at the edge, each of the laser bodies of the same row or column has a radiation-transmissive aperture facing away from the common waveguide layer.

12. The laser device according to claim 1,
wherein the common waveguide layer has at least one side surface which is provided with a radiation-reflecting mirror layer.

13. The laser device according to claim 1,
wherein the common waveguide layer has at least one side surface provided with a radiation absorbing absorber layer.

14. A method for producing the laser device according to claim 1, comprising:
   providing the common waveguide layer;
   forming a coherent laser body composite directly on the common waveguide layer; and
   structuring the coherent laser body composite into the plurality of laser bodies which are laterally spaced on the common waveguide layer.

15. A laser device comprising:
a common waveguide layer; and
a plurality of laser bodies, wherein
the laser bodies each comprise an active zone configured to generate coherent electromagnetic radiation,
the laser bodies are arranged side by side on the common waveguide layer,
the laser bodies are directly adjacent to the common waveguide layer,
the laser bodies are phase-coupled to each other via the waveguide layer during operation of the laser device,
wherein the waveguide layer comprises a first sublayer, a second sublayer and an active region arranged therebetween, the active region being located in the coupling path of the waveguide layer,
the common waveguide comprising an active region, the active region being formed as an active quantum well layer of a Wannier-Stark modulator which, during operation of the laser device, brings about a change in a refractive index of the common waveguide layer as a result of an applied electric field.

16. The laser device according to claim 15,
wherein the active region is configured to generate electromagnetic radiation and the common waveguide layer additionally serves as an optical amplifier.

17. The laser device according to claim 15,
further comprising a first electrode, a third electrode, and a second electrode disposed between the first electrode and the third electrode, wherein
the first electrode and the third electrode are assigned to a first electrical polarity of the laser device,
the second electrode is assigned to a second electrical polarity different from the first polarity,
the first electrode and the second electrode are configured for electrically contacting the laser bodies, and
the second electrode and the third electrode are configured for electrically contacting the common waveguide layer.

18. A laser device comprising a common waveguide layer, a plurality of laser bodies and a common carrier, wherein
the plurality of laser bodies each comprise an active zone configured to generate coherent electromagnetic radiation,
the plurality of laser bodies are arranged side by side on the common waveguide layer,
the plurality of laser bodies are directly adjacent to the common waveguide layer,
the plurality of laser bodies are phase-coupled to each other via the waveguide layer during operation of the laser device,
the common waveguide layer is located in the vertical direction between the common carrier and the plurality of laser bodies, and
the common waveguide layer comprises a first sublayer, a second sublayer, and an active region arranged therebetween, the active region being located in a coupling path of the waveguide layer.

* * * * *